United States Patent
Bishop

(10) Patent No.: US 10,474,960 B1
(45) Date of Patent: Nov. 12, 2019

(54) APPROXIMATE GATE AND SUPERCONTROLLED UNITARY GATE DECOMPOSITIONS FOR TWO-QUBIT OPERATIONS

(71) Applicant: International Business Machines Corporation, Armonk, NY (US)

(72) Inventor: Lev Samuel Bishop, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/171,108

(22) Filed: Oct. 25, 2018

(51) Int. Cl.
*G06N 99/00* (2019.01)
*H03K 19/195* (2006.01)
*G06N 10/00* (2019.01)
*H03K 19/20* (2006.01)
*G06N 20/00* (2019.01)

(52) U.S. Cl.
CPC .............. *G06N 10/00* (2019.01); *G06N 20/00* (2019.01); *G06N 99/00* (2013.01); *H03K 19/195* (2013.01); *H03K 19/20* (2013.01)

(58) Field of Classification Search
CPC ...... G06N 10/00; G06N 99/002; G06N 7/005; G06N 20/00; B82Y 10/00; H01L 39/223; H01L 27/18; H01L 39/025; H01L 29/66977; H01L 39/2493; H01L 25/04; H01L 39/045; H03K 19/195; H03K 17/92; H03K 3/38; Y10S 438/962; Y10S 977/933; G11C 11/44; H04L 9/0852

See application file for complete search history.

(56) References Cited

U.S. PATENT DOCUMENTS

| | | | | |
|---|---|---|---|---|
| 7,899,852 B2 * | 3/2011 | Amin | ............. | G06N 10/00 708/2 |
| 8,063,657 B2 * | 11/2011 | Rose | ............. | G06N 10/00 326/5 |
| 8,772,759 B2 * | 7/2014 | Bunyk | ............. | B82Y 10/00 257/31 |

(Continued)

FOREIGN PATENT DOCUMENTS

WO 2014015200 A1 1/2014

OTHER PUBLICATIONS

Zhang, Yong-Sheng, et al. "Conditions for optimal construction of two-qubit nonlocal gates." Physical Review A 71, 062331 (2005). 6 pages.

(Continued)

*Primary Examiner* — Vibol Tan
(74) *Attorney, Agent, or Firm* — Amin, Turocy & Watson, LLP

(57) ABSTRACT

Techniques are provided for improving quantum circuits. The technology includes approximately expanding, by a system operatively coupled to a processor, using zero to a number of applications of a super controlled basis gate, a target two-qubit operation, with the approximately expanding resulting in instances of the target two-qubit operation corresponding to the zero to the number of applications, and the target two-qubit operation is part of a source quantum circuit associated with a quantum computer. The system analyzes the instances and the super controlled basis gate, and automatically rewrites the source quantum circuit into a deployed quantum circuit based on the analyzing.

25 Claims, 6 Drawing Sheets

(56) References Cited

U.S. PATENT DOCUMENTS

| | | | | |
|---|---|---|---|---|
| 9,495,644 B2* | 11/2016 | Chudak | ............. | G06N 10/00 |
| 9,514,415 B2* | 12/2016 | Bocharov | ............. | G06N 10/00 |
| 9,547,826 B2* | 1/2017 | King | ............. | G06F 15/76 |
| 10,082,539 B2* | 9/2018 | Jasionowski | ............. | G01R 31/3177 |
| 10,127,499 B1* | 11/2018 | Rigetti | ............. | G06N 10/00 |
| 10,192,168 B2* | 1/2019 | Rigetti | ............. | G06F 13/36 |
| 10,223,643 B1* | 3/2019 | Bishop | ............. | H04B 3/32 |
| 2017/0220948 A1 | 8/2017 | Bocharov et al. | | |
| 2017/0286858 A1* | 10/2017 | La Cour | ............. | G06F 7/48 |
| 2018/0052806 A1* | 2/2018 | Hastings | ............. | G06N 10/00 |
| 2018/0096257 A1* | 4/2018 | Lucarelli | ............. | G05B 19/4155 |
| 2018/0107939 A1 | 4/2018 | Schoennenbeck et al. | | |
| 2018/0129965 A1 | 5/2018 | Bocharov et al. | | |
| 2018/0129966 A1 | 5/2018 | Kliuchnikov et al. | | |
| 2018/0260730 A1 | 9/2018 | Reagor et al. | | |
| 2018/0276014 A1 | 9/2018 | Kliuchnikov et al. | | |
| 2019/0102496 A1* | 4/2019 | Bishop | ............. | G06F 17/5022 |

OTHER PUBLICATIONS

Mohammadi, Majid, et al. "Controlled gates for multi-level quantum computation." Quantum Inf Process (2011) 10:241-256. 16 pages.

Shende, Vivek V., et al. "Minimal Universal Two-Qubit CNOT-based Circuits." arXiv:quant-ph/0308033v3 Mar. 12, 2004. 8 pages.

* cited by examiner

APPROXIMATE GATE AND SUPERCONTROLLED UNITARY GATE DECOMPOSITIONS FOR TWO-QUBIT OPERATIONS

BACKGROUND

The subject disclosure relates to quantum circuits, e.g., quantum circuit design. Quantum computing employs quantum physics to encode and process information, rather than binary digital techniques based on transistors. A quantum computing device employs quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored into individual qubit states. For instance, a state of a first qubit can depend on a state of a second qubit. As such, a quantum circuit can employ qubits to encode and process information in a manner that can be significantly different from binary digital techniques based on transistors. However, the designing of quantum circuits often can be relatively difficult and/or time consuming.

With regard to quantum circuit design, a conventional approach can use a universal quantum computing circuit that can be utilized for virtually all types of algorithms. The universal quantum computing circuit typically can have qubits that can be connected to all of their neighbor qubits, and typically can run all or virtually all types of algorithms, although with varying and/or limited levels of performance, due at least in part to, for example, resource limits and design constraints, as well as the universal nature of the connectivity of the qubits in the universal quantum computing circuit.

Another conventional approach to improving the operation of quantum circuits involves identifying two-qubit operations (corresponding to one or more two-qubit gates) in a circuit and trying to simplify them. One way to simplify a gate is to either approximate or expand the two-qubit gate by different processes. Universal gates can be used to expand the gates to be simplified, though because of their varying and/or limited levels of performance, their use often does not simplify a circuit.

An example of a universal gate that is known to be able to simplify some two-qubit gates is a super controlled gate. Any operation on two-qubits can be implemented using at most three super controlled gates. Operations on two-qubits can also be termed Special Unitary (4) operations (SU(4)). One type of super controlled gate is the controlled NOT (CNOT) gate and it is known that, as a super controlled gate, any operation on two-qubits can be implemented using zero or at most three CNOT gates.

With these known approaches to improving the operation of quantum circuits however, there are problems. The conventional approaches noted above only use a discrete single-qubit basis set for expanding expressions. Based on this limited basis set, these approaches have a problem accurately handling a variety of different expressions without significant inaccuracy. These approaches also do not perform simplification operations while considering performance problems that can result from the use of certain two-qubit gates, e.g., they fail to consider problems with inaccuracies that can result from the use of certain two-qubit gates and/or certain numbers of the same two-qubit gates.

These and other problems of conventional quantum computing circuit design approaches can result in inaccuracies as well as inefficient and/or ineffective circuits and/or inefficient performance of a quantum circuit design.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a computer-implemented method can comprise approximately expanding, by a system operatively coupled to a processor, using zero to a number of applications of a super controlled basis gate, a target two-qubit operation and the approximately expanding can result in instances of the target two-qubit operation corresponding to the zero to the number of applications, and the target two-qubit operation is part of a source quantum circuit associated with a quantum computer. The system can analyze the instances and the super controlled basis gate, and automatically rewrite the source quantum circuit into a deployed quantum circuit based on the analyzing. The computer-implemented method can have a number of advantages, including that automatically rewriting the source quantum circuit into the deployed quantum circuit based on embodiments can improve processing performance and accuracy of the deployed circuit, with embodiments providing an efficient mechanism to determine whether to use approximate or exact expansions of the target two-qubit operations.

According to another embodiment, a computer-implemented method can comprise approximately expanding, by a system operatively coupled to a processor, using zero to a number of applications of a super controlled basis gate, a target two-qubit operation, and the approximately expanding results in instances of the target two-qubit operation corresponding to the zero to the number of applications. The target two-qubit operation can be part of a source quantum circuit associated with a quantum computer, and the instances comprise both the target two-qubit operation and the target two-qubit operation concatenated with an exchange of two qubits and the target two-qubit operation. The system determines an average fidelity of at least one of the approximately expanded instances and automatically rewrites the source quantum circuit into a deployed quantum circuit based on the average fidelity of at least one of the instances. In an aspect, automatically rewriting the source quantum circuit into the deployed quantum circuit can improve processing performance of the deployed quantum circuit. The computer-implemented method can have a number of advantages, including that automatically rewriting the source quantum circuit into the deployed quantum circuit based on embodiments can improve processing performance and accuracy of the deployed circuit, as well as consideration of mirror operations associated with the target two-qubit operation.

According to yet another embodiment, a system can comprise a memory that stores computer executable components and a processor that executes computer executable components stored in the memory, with the computer executable components comprising a circuit expanding component that approximately expands, using zero to a number of applications of a super controlled basis gate, an identified block of consecutive operations on pairs of qubits. The approximately expanding results in instances of the identified block corresponding to the zero to the number of applications, and the identified block is part of a source quantum circuit associated with a quantum computer. An analyzer component that analyzes the instances and a circuit rewriting component that rewrites the source quantum circuit into a quantum processing unit (QPU) hardware circuit based on the analyzing the instances. The system can have a number of advantages, including that automatically rewriting the source quantum circuit into the circuit based on embodiments can improve processing performance and accuracy of the deployed circuit, with embodiments providing an efficient mechanism to determine whether to use approximate or exact expansions of the target two-qubit operations.

According to another embodiment, a computer-implemented method can comprise approximately expanding, by a system operatively coupled to a processor, using zero to a number of applications of a basis gate, a target two-qubit operation, with the approximately expanding resulting in instances of the target two-qubit operation corresponding to the zero to the number of applications and the basis gate is selected based on a similarity to a super controlled basis gate. The target two-qubit operation is part of a source quantum circuit associated with a quantum computer. The system analyzes the instances and automatically rewrites the source quantum circuit into a deployed quantum circuit based on the analyzing the instances. The computer-implemented method can have a number of advantages, including that automatically rewriting the source quantum circuit into the deployed quantum circuit based on embodiments can improve processing performance and accuracy of the deployed circuit, including selection of a basis gate based on a similarity to a super controlled basis gate.

According to yet another embodiment, a computer program product facilitating rewriting a source quantum circuit into a deployed quantum circuit associated with a quantum computer can comprise a computer readable storage medium having program instructions embodied therewith. The program instructions are executable by a processor to cause the processor to approximately expand, by a system operatively coupled to a processor, using zero to a number of applications of a super controlled basis gate, a target two-qubit operation, with the approximately expanding resulting in instances of the target two-qubit operation corresponding to the zero to the number of applications, and the target two-qubit operation is part of a source quantum circuit associated with a quantum computer. The instructions further cause the processor to analyze the instances and the super controlled basis gate and automatically rewrite the source quantum circuit into a deployed quantum circuit based on the analyzing. The computer program product can have a number of advantages, including that automatically rewriting the source quantum circuit into the deployed quantum circuit based on embodiments can improve processing performance and accuracy of the deployed circuit, with embodiments providing an efficient mechanism to determine whether to use approximate or exact expansions of the target two-qubit operations.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information, in contrast to binary digital techniques based on transistors. For example, a quantum computer can employ quantum bits (e.g., qubits), which are basic units of quantum information. Qubits operate according to a superposition principle of quantum physics and an entanglement principle of quantum physics. The superposition principle of quantum physics states that each qubit can represent both a value of "1" and a value of "0" at the same time. The entanglement principle of quantum physics states that qubits in a superposition can be correlated with each other. For instance, a state of a first value (e.g., a value of "1" or a value of "0") can depend on a state of a second value. As such, a quantum computer can employ qubits to encode information and employ qubit operations (or qubit gates) to modify qubits for quantum processing.

Figure 1:
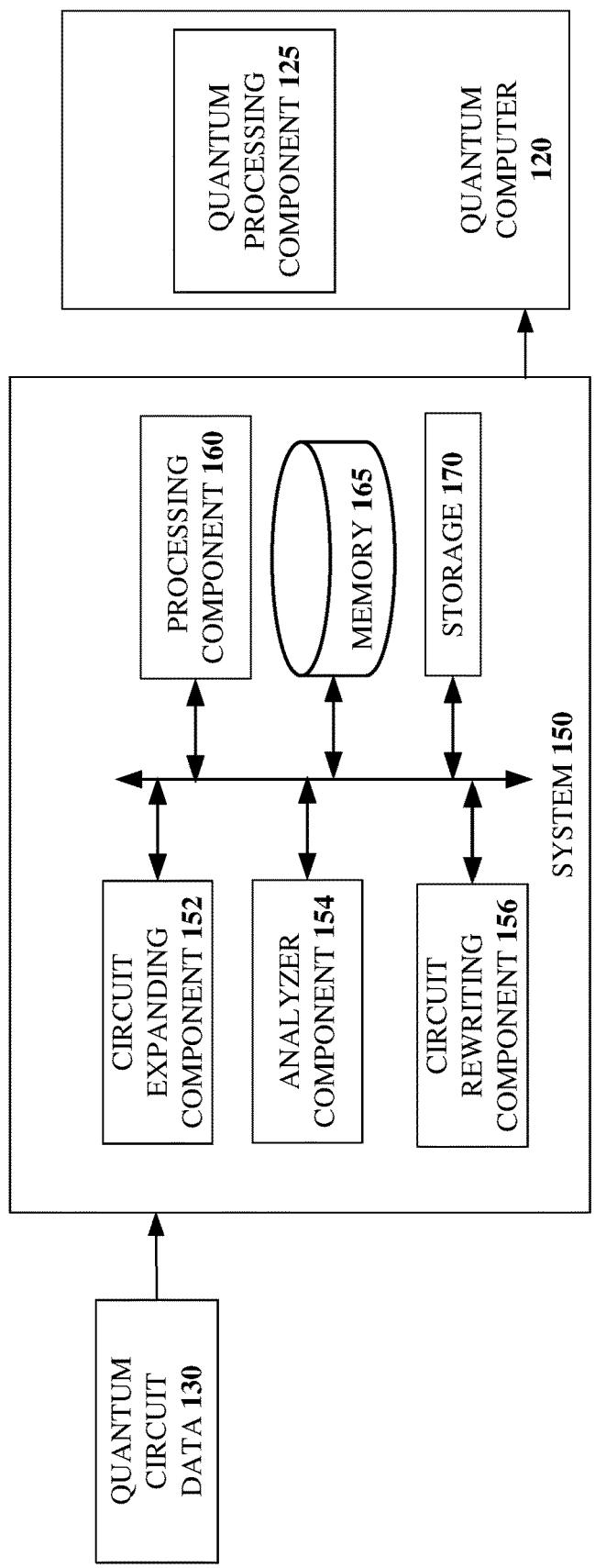
FIG. 1 illustrates a block diagram of an example, non-limiting system that includes a circuit expanding component, an analyzer component, and a circuit rewriting component in accordance with one or more embodiments described herein.

FIG. 1 illustrates a block diagram of an example, non-limiting system 150 facilitating the analysis of quantum circuits for different purposes, including improving performance, accuracy, and design. System 150 can receive quantum circuit data 130, either a single circuit identified to be processed or multiple circuits to be assessed individually or in conjunction with other circuits of the multiple circuits, and system 150 can include a circuit expanding component 152, an analyzer component 154, and a circuit rewriting component 156 in accordance with one or more embodiments described herein. Repetitive description of like elements employed in other embodiments described herein is omitted for sake of brevity.

To facilitate processes, store results, and provide storage for processor executable components, system 150 accesses memory 165 and storage 170, these respectively being, for example, Random Access Memory (RAM) and a hard drive. Processing component 160 can receive executable instructions from memory 165 and storage 170 and execute functional components, such as 152, 154, and 156 discussed above.

System 150 can process quantum circuit data 130 (also termed 'source quantum circuit data') and provide results to quantum computer 120, the results being, for example, modified quantum circuit data executable by quantum processing component 125, e.g., a quantum processing unit (QPU) (also termed 'deployed quantum circuits'). Other aspects of an operating environment in which one or more embodiments described herein can be facilitated is discussed further below with a discussion of FIG. 6.

To provide a solution to the problem of simplifying quantum circuits, circuit expanding component 152 can receive quantum circuit data 130 (also termed 'target operations' and 'target gates') and can expand one or more target operations according to different criteria (not shown in FIG. 1, discussed with FIG. 2) and a basis gate. Selecting the number and type of gates used in a target operation can change many characteristics of the target operation, and provide a solution to problems associated with, for example, performance, fidelity, ease of design, and ease of integrating into a broader collection of operations. In an embodiment, circuit expanding component 152 expands the target operations by generating multiple versions (also termed 'instances') of the target operations. Different approaches can be used to change the target operations for different instances, with an approach used that selects a basis gate and generates instances for a selected number of times the selected basis gate is used to expand the target operation. Other approaches can also be used to generate instances.

In an example, to expand a target operation, one or more embodiments generate instances of the target operation corresponding to multiple instances of an application of the basis gate. The number of instances generated can be selected based on characteristics of the basis gate, i.e., when the basis gate selected is a CNOT gate, four expressions are generated by embodiments, including for example four instances of the following: use of no CNOT gates, use of one CNOT gate, use of two CNOT gates, and use of three CNOT gates.

It should be noted that, for the instances generated by embodiments that duplicate an operation exactly (e.g., by using three-super controlled basis gates) the simplification by these instances can be termed an expansion, while when instances are an approximation of a target operation, the simplification of these instances can be termed an approximation. Because one or more embodiments simplify exactly and approximately, expansions discussed herein can be termed approximate expansions. For convenience, these approximate expansions can also be termed as expansions herein.

As discussed further herein, one or more embodiments consider a trade-off between a reduction in fidelity and an increase in performance when implementing the resulting expression, i.e., there can be advantages to designing circuits considering some of the competing considerations discussed above.

In one or more embodiments, instances of the target operation generated by circuit expanding component 152 can be analyzed by analyzer component 154 based on different criteria. One approach used by embodiments employs a determined measure of the fidelity of the instance to the original target operation. It should be noted that, because determinations of fidelity by one or more embodiments are generally directed to a fidelity predicted to be realized when an expression is implemented, expressions of determined fidelity discussed herein can also be termed "predicted" fidelity.

Another approach considers the number and type of basis gates used to generate the expression, e.g., CNOT gates are known to potentially introduce inaccuracies and cause performance problems, so instances having fewer of these gates can be preferred by one or more embodiments. Other approaches of evaluating instances for use are discussed below.

In one or more embodiments, once instances have been analyzed, an instance can be selected based on different criteria for rewriting by circuit rewriting component 156. Rewriting generally involves using a selected instance of the target operation to generate a new operation (also termed an 'deployed quantum circuit') for use with quantum computer 120.

The system 150 can employ hardware and/or software to solve problems that are highly technical in nature, including expanding, evaluating, and redesigning quantum circuit data, that are not abstract and that cannot be performed as a set of mental acts by a human. Further, in certain embodiments, some of the processes performed can be performed by one or more specialized computers (e.g., one or more specialized processing units, a specialized computer such as tomography and reconstruction, statistical estimation, and so on) for carrying out defined tasks related to machine learning. The system 150 and/or components of the system 150 can be employed to solve new problems that arise through advancements in technologies mentioned above, computer architecture, and/or the like.

One or more embodiments of the system 150 can provide technical improvements to operations performed by quantum circuit systems, quantum processor systems, quantum computing systems, artificial intelligence systems, and/or other systems. One or more embodiments of the system 150 can also provide technical improvements to operations performed by quantum processor (e.g., a superconducting quantum processor) by improving processing performance of the quantum processor, improving processing efficiency of the quantum processor, improving processing characteristics of the quantum processor, improving timing characteristics of the quantum processor and/or improving power efficiency of the quantum processor. All of the above-discussed quantum computer processors can be represented by quantum processing component 125.

Figure 2:
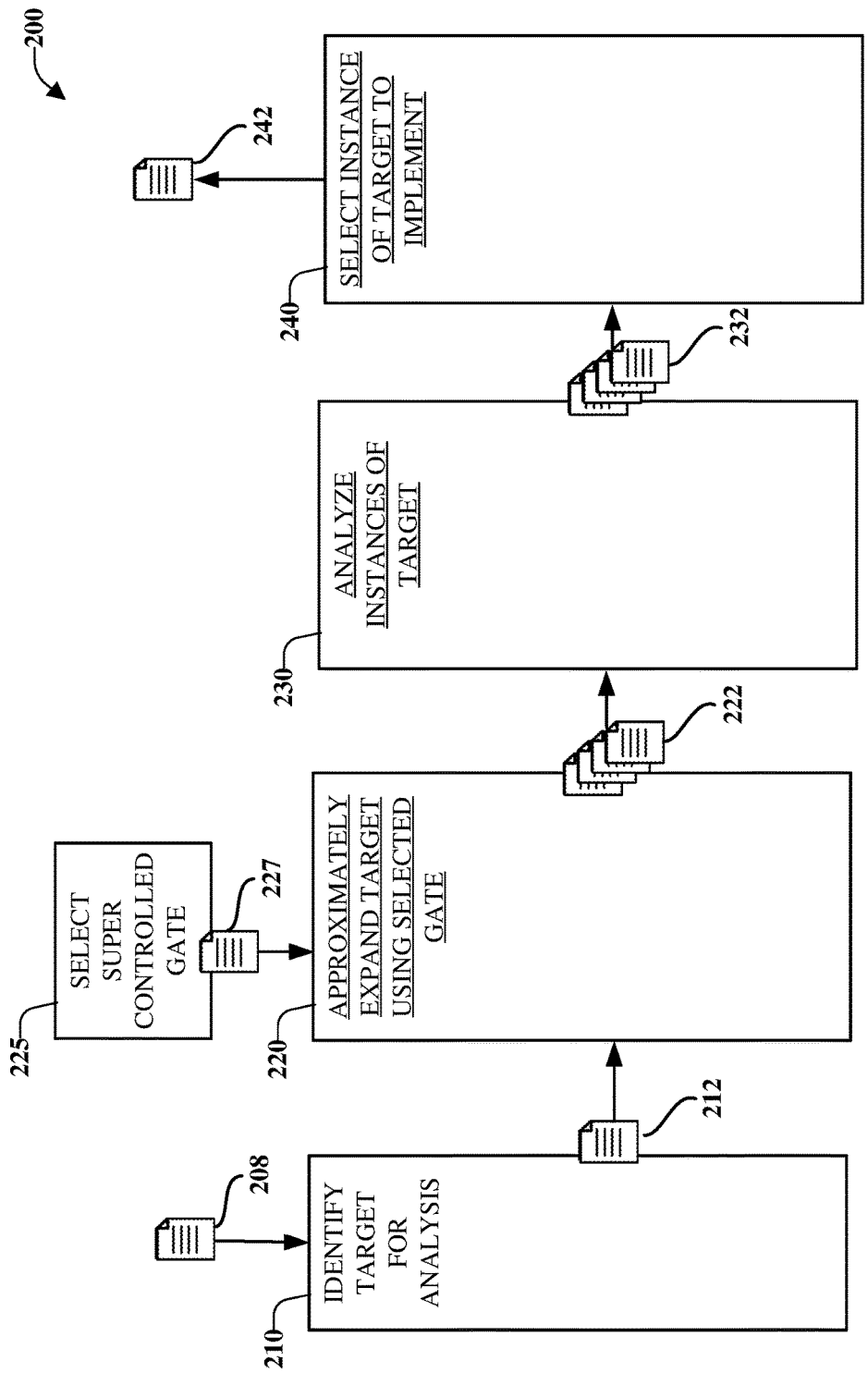
FIG. 2 illustrates a block diagram that includes an example of identifying a target basis gate for analysis, analyzing the target basis gate, and rewriting the target basis gate based on the analyzing in accordance with one or more embodiments described herein.

FIG. 2 illustrates a block diagram 200 that represents a more detailed description of processes similar to those used by embodiments discussed above. In this example, target operation 208 is a two-qubit expression (also termed an 'SU(4)' expression) and the approach used by circuit expanding component 152 is to vary the number of uses of a single selected type of basis gate—super controlled two-qubit basis gate 227.

In this example, in block 225, super controlled two-qubit basis gate 227 is selected as an basis gate for expanding the target operation. This process provides expansion information for use by block 220, approximately expanding the target operation using the selected basis gate. In an embodiment, this basis gate used can be pre-set or selected from an available group of basis gates based on different criteria. One approach used for these criteria uses characteristics of a quantum computer for which modified target expressions are to be used (e.g., quantum computer 120 receiving a deployed circuit from system 150). Thus, in one or more embodiments, characteristics of a quantum computer are determined and these characteristics are used to select a specific basis gate of a collection of basis gates.

In block 220, instances of target operation 212 are generated (i.e., target operation 212 is approximately expanded) with the selected super controlled two-qubit basis gate 227. In one or more embodiments, instances can be created by varying the number of uses of the selected basis gate in different instances. In this example, for super controlled two-qubit basis gate 227, the number of gates used by instances can vary from zero (0) to three (3). As noted above, and as would be appreciated by one having skill in the relevant art(s), given the description herein, any given operation on two-qubits can be implemented using from zero to at most three super controlled two-qubit basis gates. Creating instances for comparison using 0-3 super controlled gates is thus an efficient way of generating instances (i.e., any more than 3 could degrade performance and slow the instance creating process). For generating instances by one or more embodiments, different numbers of gates could also be used for different target operations. In this example, using super controlled two-qubit basis gate 227, four instances 222 are generated and passed to block 230.

In block 230, the instances of the target operation are analyzed by embodiments based on different criteria. In this example, fidelity is generated for the instances according to processes discussed in more detail with the description of FIG. 3 below.

In block 240, an instance of the generated instances (e.g., one of 0, 1, 2, 3 uses of super controlled two-qubit gate) is selected based on measurements generated in block 230. In an embodiment, the selected instance is rewritten (i.e., a new version of the original target operation 212 or source quantum circuit) to a deployed quantum circuit 242 (i.e., one that is in a condition for execution by quantum processing component 125). In this example, of the four instances 232 with 0, 1, 2, or 3 uses (also termed 'applications') of super controlled two-qubit basis gate 227, one is selected with the highest fidelity, as generated during the process described with block 230. These processes are discussed in more detail with the description of FIGS. 3-5 below.

Figure 3:
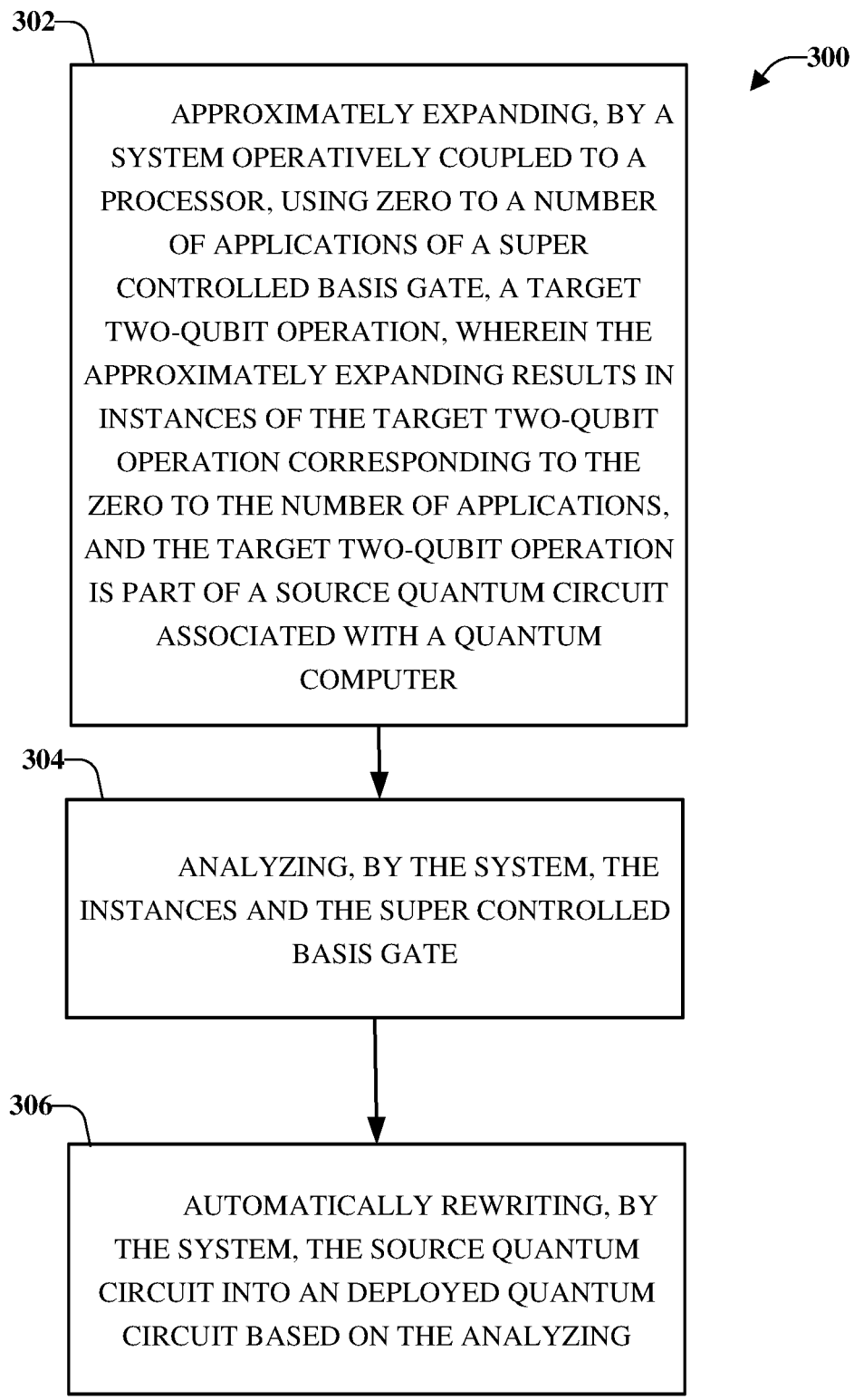
FIG. 3 illustrates a flow diagram of an example, non-limiting computer-implemented method facilitating rewriting a source quantum circuit into a deployed circuit using an approach that determines predicted fidelities of approximately expanded instances of a target two-qubit operation in accordance with one or more embodiments described herein.
Figure 4:
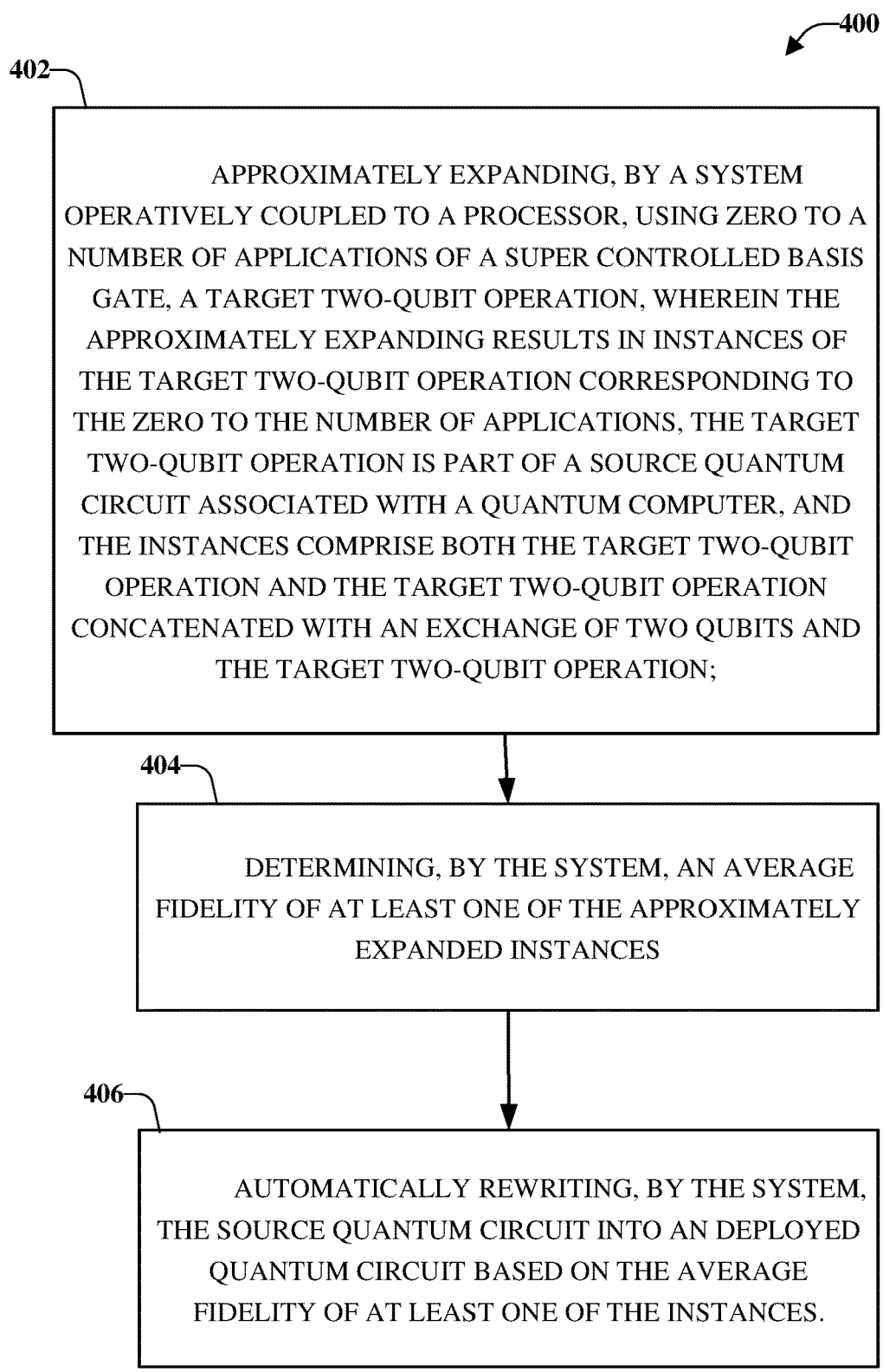
FIG. 4 illustrates a flow diagram of an alternative embodiment, the flow diagram being an example, non-limiting computer-implemented method facilitating rewriting a source quantum circuit into a deployed circuit using an approach that determines predicted fidelities of approximately expanded instances of a target two-qubit operation, with the expanded instances including mirror operations of the other instance operations, in accordance with one or more embodiments described herein.
Figure 5:
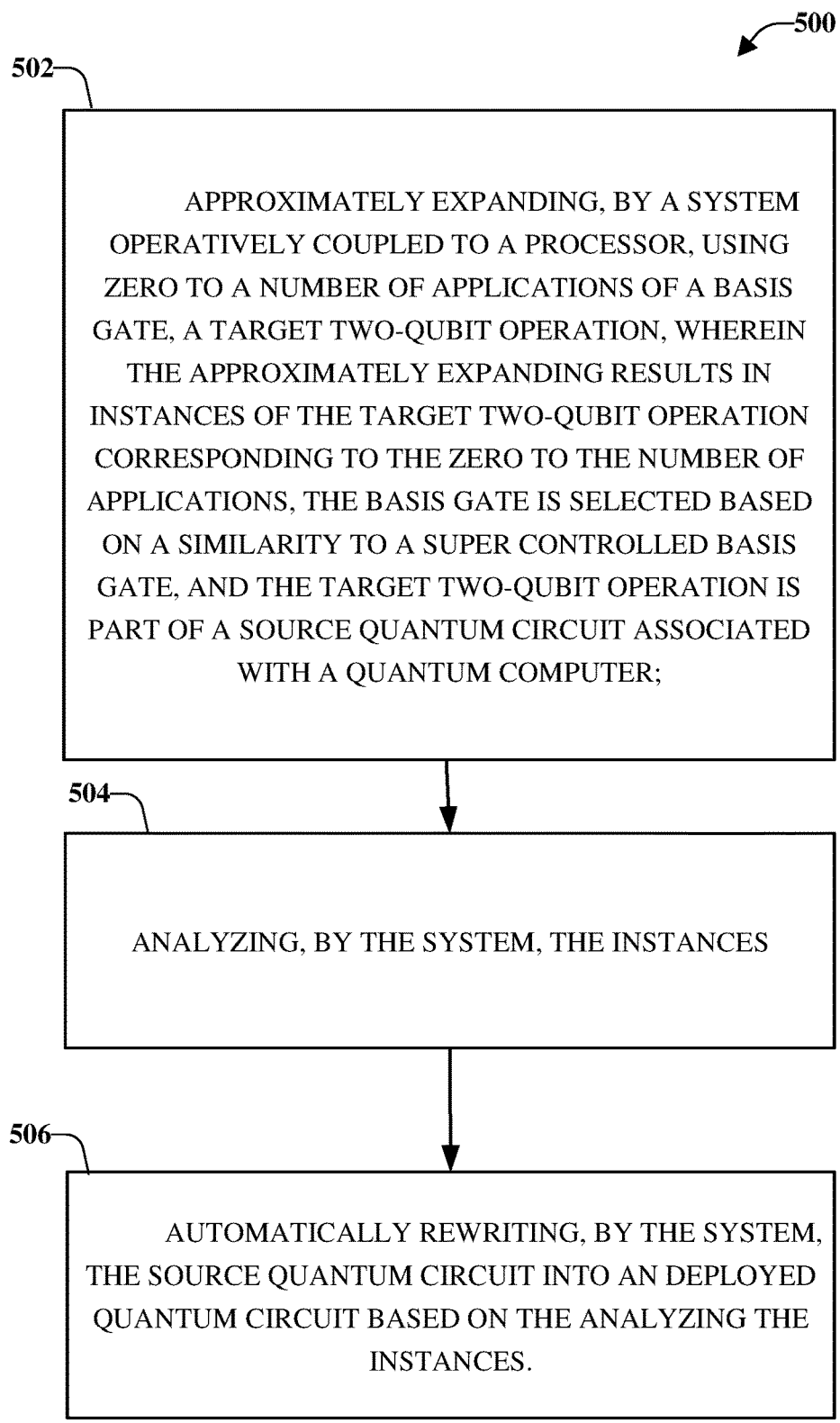
FIG. 5 illustrates a flow diagram of an alternative embodiment, the flow diagram being an example, non-limiting computer-implemented method facilitating rewriting a source quantum circuit into a deployed circuit using an approach that determines predicted fidelities of approximately expanded instances of a target two-qubit operation using a basis gate determined to be similar to a super controlled basis gate, in accordance with one or more embodiments described herein.

FIGS. 3-5 illustrate a flow diagram of different embodiments described herein, executable, for example by a system (e.g., system 150) operatively coupled to a processor (e.g., processing component 160). For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the relevant art(s) will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media, e.g., a computer readable storage medium having program instructions embodied therewith.

Moreover, because at least the expanding target operations, analyzing the instances of expanded target operations, selecting instances, and generating (also termed 'rewriting') quantum circuits for use on a quantum computer (also termed 'deployed quantum circuits'), are established from a combination of electrical and mechanical components and circuitry, a human is unable to replicate or perform processing performed by the embodiments described herein, e.g., system 150 and the computer implemented methods shown in FIGS. 3-5.

FIG. 3 illustrates a flow diagram of an example, non-limiting computer-implemented method 300 facilitating rewriting a source quantum circuit into a deployed circuit using an approach that determines fidelities of approximately expanded instances of a target two-qubit operation in accordance with one or more embodiments described herein. Repetitive description of like elements employed in other embodiments described herein is omitted for sake of brevity.

Operation 302 represents approximately expanding, using zero to a number of applications of a super controlled basis gate, a target two-qubit operation, resulting in instances of the target two-qubit operation corresponding to the zero to the number of applications, the target two-qubit operation being part of a source quantum circuit associated with a quantum computer. Operation 304 represents analyzing the instances and the super controlled basis gate. Operation 306 represents automatically rewriting, by the system, the source quantum circuit into a deployed quantum circuit based on the analyzing.

At least one embodiment of operation 302 (e.g., performed by circuit expanding component 152 in system 150 and represented by block 220 of FIG. 2) can be described and explained using mathematical formulas and other ways of describing quantum operations. For example, every two-qubit operation in SU(4) may be expanded in the format of equations #1 below.

$$(K_1^l \otimes K_1^r) \cdot U_d(\alpha,\beta,\gamma) \cdot (K_2^l \otimes K_2^r)$$

$$U_d(\alpha,\beta,\gamma)=e^{i(\alpha\sigma_x\otimes\sigma_x+\beta\sigma_y\otimes\sigma_y+\gamma\sigma_z\otimes\sigma_z)} \quad \text{Equations \#1}$$

With respect to equations #1, one having skill in the relevant art(s), given the description herein, would appreciate that the operators K are single-qubit operations in SU(2) and $U_d(\alpha, \beta, \gamma)$ is a three-parameter family of two-qubit operations. One or more embodiments described herein expand the target operation to generate instances of the target operation by processing a representation of the target operation in $U_d(\alpha, \beta, \gamma)$ form and modifing the $\alpha$, $\beta$, $\gamma$ coefficients according to particular criteria, e.g., based a number (e.g., 0-4) of super controlled basis gates applied to generating a revised version (instance) of the target operation to be analyzed (e.g., by operation 304). One having skill in the relevant art(s), given the description herein, would appreciate that the basic approach described above (expanding into instances for analysis, etc.) can be performed using other approaches, without departing from the scope and spirit of the embodiments described herein.

Examples of the operations used to expand a target operation and generate instances are included below. In this example, the basis gate used is a super controlled two-qubit basis gate (in this example a CNOT gate) and has $U_d(\alpha, \beta, \gamma)$ corresponding to equation #2 below:

$$U_d(\pi/4, \beta, 0) \qquad \text{Equation \#2}$$

Given the above example, the equations (3, 4, 5, 6) below can be used by one or more embodiments to approximately expand a $U_d(\alpha, \beta, \gamma)$ form of the target operation using 0, 1, 2, and 3 super controlled basis gates respectively.

$$U_d(0,0,0) \qquad \text{Equation \#3}$$

$$U_d(\pi/4, \beta, 0) \qquad \text{Equation \#4}$$

$$U_d(\alpha, \beta, 0) \qquad \text{Equation \#5}$$

$$U_d(\alpha, \beta, \gamma) \qquad \text{Equation \#6}$$

Continuing this example, embodiments of operation 304 (e.g., block 230 and analyzer component 154) can be used to analyze the instances generated by equations 3-6 above. In one or more embodiments, the fidelity of an instance as generated above can be determined by approximating a target gate (generated instance) equivalent to equation #7 below, by a basis gate (also termed 'implemented gate') equivalent to equation #8 below.

$$U_d(\alpha_{target}, \beta_{target}, \gamma_{target}) \qquad \text{Equation \#7}$$

$$U_d(\alpha_{imp}, \beta_{imp}, \gamma_{imp}) \qquad \text{Equation \#8}$$

Based on the target gate and implemented gate respectively described by equations #7 an #8 above, one or more embodiments can determine an average fidelity ($F_{avg}$) of the target gate, using optimal single qubit pre- and post-rotations, by employing equation #9 below where equation #10 describes the coefficients of equation #9.

$$F_{avg}(U_{target}, U_{impl}) = \frac{4 + 16|\cos(\Delta_\alpha)\cos(\Delta_\beta)\cos(\Delta_\gamma) + i\sin(\Delta_\alpha)\sin(\Delta_\beta)\sin(\Delta_\gamma)|^2}{20} \qquad \text{Equation \#9}$$

$$\Delta_\alpha = \alpha_{target} - \alpha_{imp}, \Delta_\beta = \beta_{target} - \beta_{imp}, \Delta_\gamma = \gamma_{target} - \gamma_{imp} \qquad \text{Equation \#10}$$

Thus, based on the operation of embodiments and the descriptions above the total fidelity (including the fidelity of each instance, e.g., due to use of 0, 1, 2, or 3 basis gates (e.g., super controlled two-qubit basis gate 227) can be described by the set of equations below, labeled as equations #11. These equations can also be described as determining a maximum predicted fidelity of the instances, this maximum predicted fidelity being based on multiplying the average fidelity of the instance by a predicted fidelity of a super controlled basis gate raised to a power of a total number of the super controlled basis gates used by the instance.

$$F_0 = \frac{4 + 16|\cos(\alpha_{target})\cos(\beta_{target})\cos(\gamma_{target}) + i\sin(\alpha_{target})\sin(\beta_{target})\sin(\gamma_{target})|^2}{20}$$

$$F_1 = \frac{1}{20}[4 + 16|\cos(\alpha_{target} - \pi/4)\cos(\beta_{target} - \beta_{basis})\cos(\gamma_{target}) +$$
$$i\sin(\alpha_{target} - \pi/4)\sin(\beta_{target} - \beta_{basis})\sin(\gamma_{target})|^2]F_{basis}$$

$$F_2 = \frac{4 + 16|\cos(\gamma_{target})|^2}{20} F_{basis}^2$$

$$F_3 = F_{basis}^3$$

Based on the above equations, in at least one embodiment, constructions such as is represented by equation #11B can be determined, where coefficients are set as specified in equations #11C below:

$$(K_{1,target}^l \otimes K_{1,target}^r) \cdot U_{approx} \cdot (K_{2,target}^l \otimes K_{2,target}^r) \qquad \text{Equation \#11B}$$

$$U_{approx}^{(0)} = U_d(0,0,0),$$

$$U_{approx}^{(1)} = U_d(\alpha_{basis}, \beta_{basis}, \gamma_{basis}),$$

$$U_{approx}^{(2)} = U_d(\alpha_{target}, \beta_{target}, 0),$$

$$U_{approx}^{(3)} = U_d(\alpha_{target}, \beta_{target}, \gamma_{target}) \qquad \text{Equations \#11C}$$

Continuing this example, embodiments of operation 306 (e.g., block 240 and circuit rewriting component 156) can be used to rewrite the target circuit based on the analyzing operations described in equations 7-11 and throughout this disclosure. One approach to employing the analyzing results to rewrite the target operation is to compare the generated instances (e.g., generated by equation 3-6) by some criteria, for example, the determined fidelity of each instance due to each use of the basis gate by the instance (also termed '$F_{basis}$') (as generated by equations 7-11). In one or more embodiments where fidelity is determined on a basis of comparing generated instances, the instance with the highest overall fidelity over the set $\{F_i, i=0 \ldots 3\}$ can be selected as an instance for rewriting into a deployed quantum circuit.

In an alternative embodiment that involves differences in expansion of target operations by operation 302 above, before expansion by the processes discussed above, operations in $U_d(\alpha, \beta, \gamma)$ are modified to improve the final result. In this embodiment, it is preferred that any duplicate representations of operations in $U_d(\alpha, \beta, \gamma)$ and the basis gate be removed from consideration such that only unique $\alpha, \beta, \gamma$ coefficients are expanded and considered. One approach to removing these duplicates is to employ Weyl chamber representation of the target operation and basis gate in $U_d(\alpha, \beta, \gamma)$ form. For example, with respect to the representation of the target operation shown in equation #1 above (CNOT), equation #12 below represents restriction by a Weyl chamber representation.

$$\pi/4 \geq \alpha \geq \beta \geq |\gamma| \qquad \text{Equation \#12}$$

Equations #11A

In one or more embodiments, after an expression is modified based on the Weyl chamber representation, the expanding of that expression is not approximate, rather is it exactly expanded.

It should be noted that this Weyl chamber representation of a target operation can be used in place of the target operations discussed herein, and the examples discussed herein where a target operation is referenced can also be considered as implemented by employing a Weyl chamber representation of the target operation.

Additionally, it should also be noted that, as described above, to accurately expand a variety of expressions, one or more embodiments described herein can employ a continuous set of single-qubit gates in SU(2) for expanding expressions (if a QPU is able to execute arbitrary single-qubit SU(2) operations exactly), in addition to approximately expanding SU(2) expressions from discrete single-qubit basis gates if required. Because existing approaches only use discrete single-qubit basis gates (i.e., not also employing a continuous set of single-qubit gates in SU(2) as in one or more embodiments), one or more embodiments solve the conventional problems with flexibly handling different expressions with negligible inaccuracy.

FIG. 4 illustrates a flow diagram of an example, non-limiting computer-implemented method 400 facilitating the rewriting of target operations into different operations for use, in accordance with one or more embodiments described herein. Repetitive description of like elements employed in other embodiments described herein is omitted for sake of brevity. FIG. 4 illustrates an alternate embodiment in some respects from the embodiments discussed in FIG. 3. Some differences in this alternative approach involve the approximate expansion of a target operation into instances using the basis gate, e.g., a mirror or swap operation of generated expressions are considered in addition to the other generated instances.

For any operation expressed as in equation #1 above, then a swap (also termed U.SWAP or "mirror" gate) performed on the expression can be described by equation #13 below, where the sign function (SGN(x)) gives −1 for x<0 and +1 for x>0:

$$U_d(\pi/4-|\gamma|, \pi/4-\beta, \text{sgn}(\gamma)(\alpha-\pi/4))$$ Equation #13

The above swap expression can also be described as the target operation being concatenated with an exchange of two qubits and the target two-qubit operation.

In this embodiment, the generated instances include both the expanded target two-qubit operation and the expanded target two-qubit operation concatenated with an exchange of two qubits and the target two-qubit operation. In this embodiment, operation 406 can select instances for rewriting further based on the use (or not) of the swap operations by the analyzed instance. Adding this consideration of mirror operations can further facilitate the solving of problems associated with simplification of quantum circuits, e.g., accuracy and performance can be improved.

In one or more embodiments that generate swap instances as described above, the instance selected for rewriting (e.g., by operation 406) can be further based on minimizing a number of swap operations required to implement a containing quantum circuit of the source quantum circuit.

FIG. 5 illustrates a flow diagram of an example, non-limiting computer-implemented method 500 facilitating the rewriting of target operations into different operations for use, in accordance with one or more embodiments described herein. Repetitive description of like elements employed in other embodiments described herein is omitted for sake of brevity. FIG. 5 illustrates another alternate embodiment in some respects from the embodiments discussed in FIG. 3. Some differences in this alternative approach involve the expansion of the target expression by a basis gate, particularly, how the basis gate is selected.

In this alternative embodiment, the basis gate is not a super controlled gate. In one or more embodiments, the basis gate selected for expansion by operation 502 can be selected based on a similarity to a super controlled basis gate. With this approach to selection deviations due to differences between the basis gate and the super controlled basis gate can be reduced by local optimization of single-qubit gates by fine tuning results of the approximately expanded target two-qubit operation. An example of the fine tuning that can be used by this alternative embodiment employs a gradient-descent algorithm to reduce the deviations due to differences between the basis gate and the super controlled basis gate by acting on the single-qubit gates.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

System 150 can employ any suitable machine-learning based techniques, statistical-based techniques and/or probabilistic-based techniques. For example, the circuit rewriting component 110 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, system 150 can perform a set of machine learning computations associated with generation of the deployed quantum circuits, such as the use of: clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations.

Section II

To further provide a description of at least one embodiment, additional detailed descriptions of approaches described above are included below.

An arbitrary two-qubit unitary can be decomposed in the form:

$$U=(K_1^l \otimes K_1^r) U_d(\alpha,\beta,\gamma)(K_2^l \otimes K_2^r), \quad (1)$$

where $K^{l,r}$ are single-qubit unitaries.

$$U_d(\alpha,\beta,\gamma)=\exp[i(\alpha\sigma_x \otimes \sigma_x + \beta\sigma_y \otimes \sigma_y + \gamma\sigma_z \otimes \sigma_z)], \quad (2)$$

The Weyl chamber is also used by some embodiments in the form $\pi/4 \geq \alpha \geq \beta \geq |\gamma|$. For the formulas included below, expression "A~B" can be used to denote equivalence between A and B under local operations.

At least one embodiment determines the trace between two $U_i = Ud(\alpha_i, \beta_i, \gamma_i)$ as:

$$Tr(U_1^\dagger U_2) = 4\cos(\Delta_\alpha)\cos(\Delta_\beta)\cos(\Delta_\gamma) - 4i\sin(\Delta_\alpha)\sin(\Delta_\beta)\sin(\Delta_\gamma), \quad (3)$$

where $$\Delta_\alpha = \alpha_1 - \alpha_2 \quad (4a)$$

$$\Delta_\beta = \beta_1 - \beta_2 \quad (4b)$$

$$\Delta_\gamma = \gamma_1 - \gamma_2 \quad (4c)$$

From the trace, the average gate fidelity can be determined by at least one embodiment as:

$$F_{avg}(U_1, U_2) = \frac{4 + |Tr(U_1^\dagger U_2)|^2}{20} \quad (5)$$

Using this approach also provides, in some embodiments, the maximal fidelity between arbitrary SU(4) unitaries after optimizing over local pre- and post-rotations.

$$\max_{K_1^l, K_1^r, K_2^l, K_2^r} F_{avg}[U_1, (K_1^l \otimes K_1^r) U_2 (K_2^l \otimes K_2^r)]. \quad (6)$$

At least one embodiment can determine the decompositions of a target unitary $U_t \in SU(4)$ with the minimal number of uses of a fixed 'basis' gate $U_b$. In an example, with 0 uses of the basis non-entangling target unitaries $Ut \sim Ud(0, 0, 0)$ can be constructed, and with 1 use of the basis only target unitaries which are equivalent to the basis $Ut \sim U(\alpha_b, \beta_b, \gamma_b)$ can be constructed. For $U_b \sim CNOT\ U_d(\pi/4, 0, 0)$, for example, three uses of the basis is sufficient to cover all of SU(4). In some embodiments, decompositions using a more general 'super controlled' basis $U_b \sim U_d(\pi/4, \beta_b, 0)$, for any $\beta_b$ can be used. At least one embodiment also performs an expansion for restricted target unitaries $U_t \sim U_d(\alpha_t, \beta_t, 0)$, $\gamma_t = 0$ for any $\alpha_t, \beta_t$.

In this example, all of the above expansions are exact so that the constructed unitary $U_c$ satisfies:

$$F_{avg}(U_t, U_c) = 1, \quad (7)$$

In addition, eq. (5) of Section II also can be used by some embodiments to find the average gate fidelity due to approximating $U_t$ by fewer uses of the basis gate than is necessary for exact expansion. For example, in some embodiments, for an arbitrary target with 0 applications of $U_b$, the following equation can be used:

$$U_x^{(0)} = (K_{l,1}^l \otimes K_{l,1}^r)(K_{l,2}^l \otimes K_{l,2}^r) \quad (8a)$$

$$F_{avg}^{(0)} = [4 + 16\cos^2(\alpha_t)\cos^2(\beta_t)\cos^2(\gamma_t) + 16\sin^2(\alpha_t)\sin^2(\beta_t)\sin^2(\gamma_t)]/20. \quad (8b)$$

Figure 6:
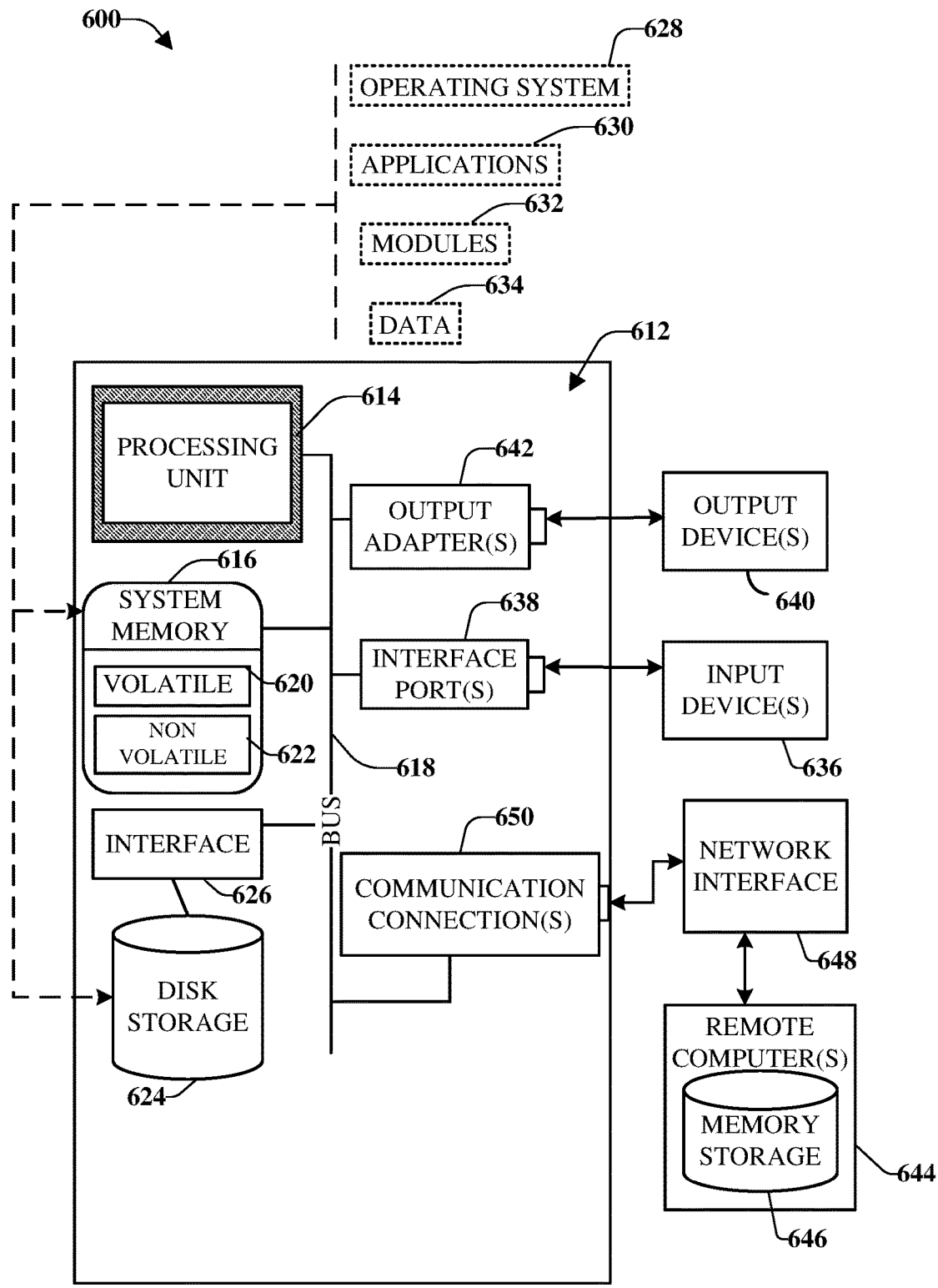
FIG. 6 illustrates a block diagram of an example, non-limiting operating environment in which one or more embodiments described herein can be facilitated in accordance with one or more embodiments described herein.

With reference to FIG. 6, a suitable operating environment 600 for implementing various aspects of this disclosure can also include a computer 612. The computer 612 can also include a processing unit 614, a system memory 616, and a system bus 618. The system bus 618 couples system components including, but not limited to, the system memory 616 to the processing unit 614. The processing unit 614 can be any of various available processors. Dual microprocessors and other multiprocessor architectures also can be employed as the processing unit 614. The system bus 618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 616 can also include volatile memory 620 and nonvolatile memory 622. The basic input/output system (BIOS), containing the basic routines to transfer information between elements within the computer 612, such as during start-up, is stored in nonvolatile memory 622. Computer 612 can also include removable/non-removable, volatile/non-volatile computer storage media. FIG. 6 illustrates, for example, a disk storage 624. Disk storage 624 can also include, but is not limited to, devices like a magnetic disk drive, floppy disk drive, tape drive, Jaz drive, Zip drive, LS-100 drive, flash memory card, or memory stick. The disk storage 624 also can include storage media separately or in combination with other storage media. To facilitate connection of the disk storage 624 to the system bus 618, a removable or non-removable interface is typically used, such as interface 626. FIG. 6 also depicts software that acts as an intermediary between users and the basic computer resources described in the suitable operating environment 600. Such software can also include, for example, an operating system 628. Operating system 628, which can be stored on disk storage 624, acts to control and allocate resources of the computer 612.

System applications 630 take advantage of the management of resources by operating system 628 through program modules 632 and program data 634, e.g., stored either in system memory 616 or on disk storage 624. It is to be appreciated that this disclosure can be implemented with various operating systems or combinations of operating systems. A user enters commands or information into the computer 612 through input device(s) 636. Input devices 636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 614 through the system bus 618 via interface port(s) 638. Interface port(s) 638 include, for example, a serial port, a parallel port, a game port, and a universal serial bus (USB). Output device(s) 640 use some of the same type of ports as input device(s) 636. Thus, for example, a USB port can be used to provide input to computer 612, and to output information from computer 612 to an output device 640. Output adapter 642 is provided to illustrate that there are some output devices 640 like monitors, speakers, and printers, among other output devices 640, which require special adapters. The output adapters 642 include, by way of illustration and not limitation, video and sound cards that provide a means of connection between the output device 640 and the system bus 618. It should be noted that other devices and/or systems of devices provide both input and output capabilities such as remote computer(s) 644.

Computer 612 can operate in a networked environment using logical connections to one or more remote computers, such as remote computer(s) 644. The remote computer(s) 644 can be a computer, a server, a router, a network PC, a workstation, a microprocessor based appliance, a peer device or other common network node and the like, and typically can also include many or all of the elements described relative to computer 612. For purposes of brevity, only a memory storage device 646 is illustrated with remote computer(s) 644. Remote computer(s) 644 is logically connected to computer 612 through a network interface 648 and then physically connected via communication connection 650. Network interface 648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 650 refers to the hardware/software employed to connect the network interface 648 to the system bus 618. While communication connection 650 is shown for illustrative clarity inside computer 612, it can also be external to computer 612. The hardware/software for connection to the network interface 648 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In one or more embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   approximately expanding, by a system operatively coupled to a processor, using zero to a number of applications of a specific super controlled basis gate, a target two-qubit operation, wherein the approximately expanding results in instances of the target two-qubit operation corresponding to the zero to the number of applications, and the target two-qubit operation is part of a source quantum circuit associated with a quantum computer;
   analyzing, by the system, the instances and the specific super controlled basis gate; and
   automatically rewriting, by the system, the source quantum circuit into a deployed quantum circuit based on the analyzing.

2. The computer-implemented method of claim 1, further comprising:
   identifying one or more super controlled basis gates based on characteristics of the quantum computer; and
   selecting the specific super controlled basis gate from the one or more super controlled basis gates.

3. The computer-implemented method of claim 1, wherein the approximately expanding comprises:
   determining Weyl chamber representations of the target two-qubit operation and the specific super controlled basis gate;
   modifying one or more of the Weyl chamber representations; and
   exactly expanding using the one or more modified Weyl chamber representations.

4. The computer-implemented method of claim 1, wherein the analyzing the instances comprises determining a predicted fidelity of the instances.

5. The computer-implemented method of claim 4, wherein the automatically rewriting is based on a maximum predicted fidelity of the instances, and wherein a maximum predicted fidelity of an instance of the instances is based on multiplying the predicted fidelity of the instance by a predicted fidelity of a super controlled basis gate raised to a power of a total number of the specific super controlled basis gates used by the instance.

6. The computer-implemented method of claim 1, wherein the automatically rewriting the source quantum circuit into the deployed quantum circuit improves processing performance of the deployed quantum circuit.

7. A computer-implemented method, comprising:
   approximately expanding, by a system operatively coupled to a processor, using zero to a number of applications of a specific super controlled basis gate, a target two-qubit operation, wherein the approximately expanding results in instances of the target two-qubit operation corresponding to the zero to the number of applications, the target two-qubit operation is part of a source quantum circuit associated with a quantum computer, and the instances comprise expansions of both the target two-qubit operation and the target two-qubit operation concatenated with an exchange of the two qubits;
   determining, by the system, an average fidelity of at least one of the approximately expanded instances; and
   automatically rewriting, by the system, the source quantum circuit into a deployed quantum circuit based on the average fidelity of at least one of the instances.

8. The computer-implemented method of claim 7, wherein the approximately expanding comprises:
   determining Weyl chamber representations of the target two-qubit operation, the target two-qubit operation concatenated with an exchange of the two qubits, and the specific super controlled basis gate;
   modifying one or more of the Weyl chamber representations; and
   exactly expanding using the one or more modified Weyl chamber representations.

9. The computer-implemented method of claim 7, wherein the automatically rewriting is further based on a maximum predicted fidelity of the instances, and wherein a maximum predicted fidelity of an instance of the instances is based on multiplying the average fidelity of the instance by a predicted fidelity of a super controlled basis gate raised to a power of a total number of the specific super controlled basis gates used by the instance.

10. The computer-implemented method of claim 7, further comprising:

executing, by the system, the deployed quantum circuit to obtain measurement data corresponding to the source quantum circuit; and outputting, by the system, the measurement data.

11. The computer-implemented method of claim 7, wherein the automatically rewriting the source quantum circuit into the deployed quantum circuit improves processing performance of the deployed quantum circuit.

12. The computer-implemented method of claim 7, wherein the automatically rewriting is further based on minimizing a number of two-qubit operations required to implement a containing quantum circuit of the source quantum circuit.

13. The computer-implemented method of claim 7, wherein the specific super controlled basis gate is a CNOT gate.

14. A system, comprising:
a memory that stores computer executable components; and
a processor that executes computer executable components stored in the memory, wherein the computer executable components comprise:
a circuit expanding component that approximately expands, using zero to a number of applications of a specific super controlled basis gate, an identified block of consecutive operations on pairs of qubits, wherein the approximately expanding results in instances of the identified block corresponding to the zero to the number of applications, and the identified block is part of a source quantum circuit associated with a quantum computer;
an analyzer component that analyzes the instances; and
a circuit rewriting component that rewrites the source quantum circuit into a quantum processing unit (QPU) hardware circuit based on the analyzing the instances.

15. The system of claim 14, wherein the circuit expanding component approximately expands the identified block of consecutive operations by using Weyl chamber representations.

16. The system of claim 14, wherein the analyzer component analyzes the instances based on a determination of a predicted fidelity of the instances.

17. A computer-implemented method, comprising:
approximately expanding, by a system operatively coupled to a processor, using zero to a number of applications of a basis gate, a target two-qubit operation, wherein the approximately expanding results in instances of the target two-qubit operation corresponding to the zero to the number of applications, the basis gate is selected based on a similarity to a super controlled basis gate, and the target two-qubit operation is part of a source quantum circuit associated with a quantum computer;
analyzing, by the system, the instances; and
automatically rewriting, by the system, the source quantum circuit into a deployed quantum circuit based on the analyzing the instances.

18. The computer-implemented method of claim 17, wherein the approximately expanding the target two-qubit operation comprises approximately expanding the target two-qubit operation by using Weyl chamber representations.

19. The computer-implemented method of claim 17, further comprising reducing deviations due to differences between the basis gate and the super controlled basis gate, by local optimization of single-qubit gates by fine tuning results of the approximately expanded target two-qubit operation.

20. The computer-implemented method of claim 19, wherein the fine tuning comprises employing a gradient-descent algorithm to reduce the deviations due to differences between the basis gate and the super controlled basis gate by acting on the single-qubit gates.

21. The computer-implemented method of claim 17, wherein the analyzing the instances comprises determining a predicted fidelity of the instances.

22. The computer-implemented method of claim 17, further comprising:
executing, by the system, the deployed quantum circuit to obtain measurement data corresponding to the source quantum circuit; and
outputting, by the system, the measurement data.

23. The computer-implemented method of claim 17, wherein the automatically rewriting the source quantum circuit into the deployed quantum circuit improves processing performance of the deployed quantum circuit.

24. A computer program product facilitating rewriting a source quantum circuit into a deployed quantum circuit associated with a quantum computer, the computer program product comprising a non-transitory computer readable storage medium having program instructions embodied therewith, the program instructions executable by a processor to cause the processor to:
approximately expand, using zero to a number of applications of a specific super controlled basis gate, a target two-qubit operation, wherein the approximately expanding results in instances of the target two-qubit operation corresponding to the zero to the number of applications, and the target two-qubit operation is part of a source quantum circuit associated with a quantum computer;
analyze the instances and the specific super controlled basis gate; and
automatically rewrite the source quantum circuit into a deployed quantum circuit based on the analyzing.

25. The computer program product of claim 24, wherein the approximately expanding comprises:
determining Weyl chamber representations of the target two-qubit operation and the specific super controlled basis gate;
modifying one or more of the Weyl chamber representations; and
exactly expanding using the one or more modified Weyl chamber representations.

* * * * *